US 6,594,801 B1

(12) United States Patent
Dishon et al.

(10) Patent No.: US 6,594,801 B1
(45) Date of Patent: Jul. 15, 2003

(54) METHOD FOR COMPRESSING A DATA STRUCTURE REPRESENTING A LAYOUT OF A VLSI DEVICE

(75) Inventors: Yishai Dishon, Herzlia (IL); Gabi Bracha, Tel-Aviv (IL)

(73) Assignee: Motorola, Inc., Schaumburg, IL (US)

( * ) Notice: Subject to any disclaimer, the term of this patent is extended or adjusted under 35 U.S.C. 154(b) by 68 days.

(21) Appl. No.: 09/706,189

(22) Filed: Nov. 3, 2000

(51) Int. Cl.[7] .............................................. G06F 17/50
(52) U.S. Cl. .................................. 716/2; 716/9; 382/145
(58) Field of Search ....................... 716/1–21; 707/100; 708/7; 703/14; 382/303, 145, 245; 704/258; 257/401, 532; 438/737

(56) References Cited

U.S. PATENT DOCUMENTS 5,634,107 A * 5/1997 Yumoto et al. ............. 711/111
5,694,481 A * 12/1997 Lam et al. ................. 382/145

* cited by examiner

Primary Examiner—Matthew Smith
Assistant Examiner—Helen Rossoshek

(57) ABSTRACT

A method (10) for compressing a data structure representing a layout of a multi layered VLSI device, the method comprising of the steps of; (11) Receiving the data structure; said data structure comprising a plurality of layer portions, each layer portion represents a single layer out of the plurality of layers; each layer comprises of functional elements and non functional elements, where the non functional elements are inserted between functional elements to provide a planar layout. (12) Generating a non-functional elements locating data structure representing the non functional elements of all layers. (13) Deleting representations of non functional elements from the data structure and adding the compressed non functional elements data structure to generate a compressed data structure representing the layout of the multi layered VLSI device.

11 Claims, 1 Drawing Sheet

METHOD FOR COMPRESSING A DATA STRUCTURE REPRESENTING A LAYOUT OF A VLSI DEVICE

FIELD OF THE INVENTION

A method for compressing a data structure representing a layout of a Vary Large Scale Integration device, block, or set of layout cells (i.e.- device) and especially a method for reducing the size of a representation of non functional elements within said VLSI device.

BACKGROUND OF THE INVENTION

Prior art methods of manufacturing, multi-layered VLSI layout require to insert non functional elements between functional elements, whenever said functional elements are relatively far from each other. Functional elements are usually parts of layout cells or wires used to connect layout cells. The insertion of non functional element assures that each layer of said multi layered layout is planar.

Usually, said layouts are generated by layout editors. Said editors usually have a design rule check tool. Said layout editors are usually able to compress a representation of functional elements, but are not adapted to compress a representation of non functional elements. Accordingly. The representation of non functional elements are vary large and reduced the efficiency of layout processing.

There is a need of an improved method that overcomes the disadvantages of prior art methods for manufacturing multi layered layouts and compress the representation of multi layered layout of VLSI devices.

BRIEF DESCRIPTION OF THE DRAWINGS

While the invention is pointed out with particularity in the appended claims, other features of the invention are disclosed by the following detailed description taken in conjunction with FIG. 1 which is a schematic description of a layer.

DETAILED DESCRIPTION OF THE DRAWINGS

The invention provides a method for compressing a data structure representing a layout of a multi layered VLSI device, the method comprising of the steps of: (A) Receiving the data structure; said data structure comprising a plurality of layer portions, each layer portion represents a single layer out of the plurality of layers; each layer comprises of functional elements and non functional elements. (B) Generating a non-functional elements locating data structure representing the non functional elements of all layers. (C) Deleting representations of non functional elements from the data structure and adding the compressed non functional elements data structure to generate a compressed data structure representing the layout of the multi layered VLSI device.

Conveniently, the data structure representing a multi layered VLSI device stores a location of said functional elements and non functional elements. Each layer portion is a two dimensional representation of functional and non functional elements. Each layer portion has a plurality of sub-cells, each sub-cell representing a content of a single two dimensional coordinate on the layer. The compressed non functional elements data structure comprises of a plurality of sub-cell, each sub-cell indicating a location of non functional elements within a three dimensional structure, said three dimensional structure comprises of all locations within the multiple layers, having a single two dimensional coordinate. The compressed non functional elements data structure comprises of a plurality of cells, each sub-cell indicating whether at least one portion of at least one non functional element is located at a single two dimensional coordinate of each layer.

Preferably, the non functional elements are adapted to provide a planar layout layer and the data structure representing a layout of a multi layered VLSI device is a GDSII format file. Functional elements are compressed by design rule check tools and the design rule check tools are not adapted to compress the non functional elements.

Figure 1:
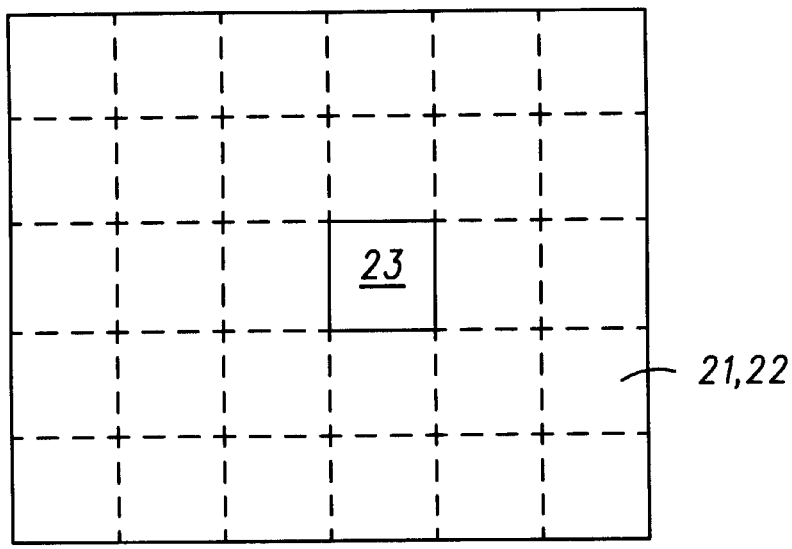

Referring to FIG. 1, conveniently, each layer 20 has N×M grid units 21, and is represented by a layer portion of N×M sub-cells 22. The compressed non functional elements data structure comprises of N×M compressed sub-cells, wherein a (n,m)'th sub-cell indicated which layer has at least a portion of a non functional element 23 at the (n,m)'th grid unit of said layer; whereas n can span between 0 and N−1 (0=<n<=N−1) and m can span between 0 and M−1 (0=<m<=M−1). The symbol '=<' means greater than or equal to. The symbol '<=' means smaller than or equal to. Preferably, the non functional elements are adapted to provide a planar layout layer.

Figure 2:
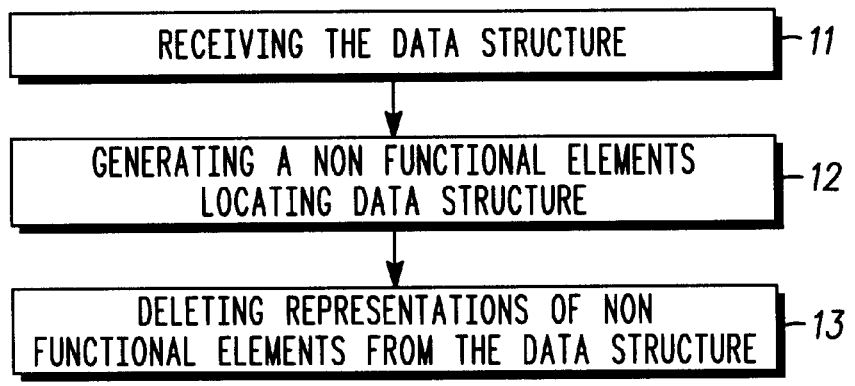
FIG. 2 which is a schematic description of a method for compressing a layout representation of a Vary Large Scale Integration device.

Referring to FIG. 2 illustrating a method 10 for compressing a layout representation of a Vary Large Scale Integration device. Method 10 comprising of steps 11, 12 and 13.

Step 11 of receiving the data structure; said data structure comprising a plurality of layer portions, each layer portion represents a single layer out of the plurality of layers; each layer comprises of functional elements and non functional elements. Step 11 is followed by step 12.

Step 12 of generating a non functional elements locating data structure representing the non functional elements of all layers. Step 12 is followed by step 13.

Step 13 of deleting representations of non functional elements from the data structure and adding the compressed non functional elements data structure to generate a compressed data structure representing the layout of the multi layered VLSI device.

Experiments and simulation have shown that said method reduces an overhead caused by the processing of non functional elements from 100–200% to 2–5%. Said processing usually comprises the following stages: DRC LVS, OPC insertion and Boolean masking. Using said process, a GDSII file containing about 2,500,000,000 bytes was compressed to a GDSII file containing about 920,000,000 bytes.

For example, it is assumed that a LVSI layout comprises of three layers, each layers has 4×4 grid units and is represented by a layer portion having 16 sub-cells. In the first layer, functional elements are placed in the following grid units: (1,4), (1,2), (1,3) and (1,4). In the second layer, functional elements are placed in the following grid units: (1,3), (1,4), (2,4), (3,1), (3,4), (4,1) and (4,4). In the third layer, functional elements are placed in the following grid units: (1,1), (1,2), (1,3), (1,4), (2,1), (2,2), (2,3), (2,4), (4,3) and (4,4). Most of the grid units are occupied by non functional elements.

A compressed non functional elements data structure comprises of 16 sub-cells (1,1)–(4,4). Assuming that the first layer is denoted '1', the second layer is denoted '2' and the third layer is denoted '3' the content of the (1,1)'th sub-cell is 2, indicating that the (1,1)'th grid unit of the second layer is occupied by a portion of a non functional element. The content of the (1,2)'th cell is 2. The content of the (1,3)'th sub-cell is 0 indicating that in all three layers the (1,2)'th grid unit is occupied by a functional element.

The compressed data structure representing the layout of the VLSI device comprises of three layer portions, each layer portion only stores information regarding functional elements, and of said compressed non functional elements data structure.

It should be noted that the particular terms and expressions employed and the particular structural and operational details disclosed in the detailed description and accompanying drawings are for illustrative purposes only and are not intended to in any way limit the scope of the invention as described in the appended claims.

Thus, there has been described herein an embodiment including at least one preferred embodiment of a method for compressing a data structure representing a layout of a VLSI device. It will be apparent to those skilled in the art that the disclosed subject matter may be modified in numerous ways and may assume many embodiments other than the preferred form specifically set out and described above. Accordingly, the above disclosed subject matter is to be considered illustrative and not restrictive, and to the maximum extent allowed by law, it is intended by the appended claims to cover all such modifications and other embodiments which fall within the true spirit and scope of the present invention. The scope of the invention is to be determined by the broadest permissible interpretation of the following claims and their equivalents rather than the foregoing detailed description.

We claim:

1. A method for compressing a data structure representing a layout of a multi layered VLSI device, the method comprising of the steps of:

receiving the data structure; said data structure comprising a plurality of layer portions, each layer portion represents a single layer out of the plurality of layers; each layer comprising functional elements and non functional elements;

compressing the functional elements using a design rule check tool that is not adapted to compress non functional elements;

generating a non functional elements locating data structure for representing only the non functional elements of all layers;

deleting the representations of the non functional elements from the data structure; and adding a compressed non functional elements data structure to generate a compressed data structure representing the layout of the multi layered VLSI device.

2. The method of claim 1 wherein the data structure representing a multi layered VLSI device stores a location of said functional elements and non functional elements.

3. The method of claim 2 wherein each layer portion is a two dimensional representation of functional and non functional elements.

4. The method of claim 3 wherein each layer portion has a plurality of sub-cells, each sub-cell representing a content of a single two dimensional coordinate on the layer.

5. The method of claim 4 wherein the compressed non functional elements data structure comprises a plurality of sub-cells, each sub-cell indicating a location of non functional elements within a three dimensional structure, said three dimensional structure comprises all locations within the multiple layers, having a single two dimensional coordinate.

6. The method of claim 4 wherein the compressed non functional elements data structure comprises a plurality of sub-cells, each sub-cell indicating whether at least one portion of at least one non functional element is located at a single two dimensional coordinate of each layer.

7. The method of claim 1 wherein the non functional elements are adapted to provide a planar layout layer.

8. The method of claim 1 wherein the data structure representing a layout of a multi layered VLSI device is a GDSII format file.

9. The method of claim 2 wherein each layer has N×M grid units, whereas each layer is represented by a layer portion of N×M sub-cells.

10. The method of claim 9 wherein the compressed non functional elements data structure comprises N×M compressed sub-cell, wherein a (n,m)'th sub-cell indicated which layer has at least a portion of a non functional element at the (n,m) grid unit of said layer; whereas $0=<n<=N-1$ and $0=<m<=M-1$.

11. The method of claim 10 wherein the non functional elements are adapted to provide a planar layout layer.

* * * * *